(12) United States Patent
Chen et al.

(10) Patent No.: US 7,112,953 B2
(45) Date of Patent: Sep. 26, 2006

(54) METHOD FOR DETECTING EPITAXIAL (EPI) INDUCED BURIED LAYER SHIFTS IN SEMICONDUCTOR DEVICES

(75) Inventors: Xinfen Chen, Plano, TX (US); Xiaoju Wu, Irving, TX (US); John K. Arch, Richardson, TX (US); Qingfeng Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 58 days.

(21) Appl. No.: 11/049,138

(22) Filed: Feb. 2, 2005

(65) Prior Publication Data

US 2006/0038553 A1    Feb. 23, 2006

Related U.S. Application Data

(60) Provisional application No. 60/602,725, filed on Aug. 18, 2004.

(51) Int. Cl.
*G01R 31/02* (2006.01)

(52) U.S. Cl. .................... 324/158.1; 324/763

(58) Field of Classification Search ...................... None
See application file for complete search history.

(56) References Cited

U.S. PATENT DOCUMENTS 5,241,361 A * 8/1993 Miki .......................... 356/614

* cited by examiner

*Primary Examiner*—Minh N. Tang
(74) *Attorney, Agent, or Firm*—Peter K. McLarty; W. James Brady, III; Frederick J. Telecky, Jr.

(57) ABSTRACT

The present invention provides a method for monitoring a shift in a buried layer in a semiconductor device. The method for monitoring the shift in the buried layer, among other steps, includes forming a buried layer test structure in, on or over a substrate of a semiconductor device, the buried layer test structure including a first test buried layer located in or on the substrate, the first test buried layer shifted a predetermined distance with respect to a first test feature. The buried layer test structure further includes a second test buried layer lodated in the substrate, the second test buried layer shifted a predetermined but different distance with respect to a second test feature. The method for monitoring the shift in the buried layer may further include applying a test signal to the buried layer test structure to determine an actual shift relative to the predetermined shift.

31 Claims, 5 Drawing Sheets

METHOD FOR DETECTING EPITAXIAL (EPI) INDUCED BURIED LAYER SHIFTS IN SEMICONDUCTOR DEVICES

CROSS-REFERENCE TO PROVISIONAL APPLICATION

This application claims the benefit of U.S. Provisional Application No. 60/602,725 entitled "PRODUCTION MONITOR OF EPI-INDUCED BURIED-LAYER SHIFT," to Xinfen Chen, et al., filed on Aug. 18, 2004, which is commonly assigned with the present invention and incorporated herein by reference as if reproduced herein in its entirety.

TECHNICAL FIELD OF THE INVENTION

The present invention is directed, in general, to a method for manufacturing semiconductor devices and, more specifically, to a method for detecting epitaxial (EPI) induced buried layer shifts in semiconductor devices and an associated method for manufacturing an integrated circuit.

BACKGROUND OF THE INVENTION

Buried layers (N-type buried layers (NBL) and P-type buried layers (PBL)) are often used in mixed signal technologies to improve component performance. These buried layers are used for vertical isolation, punchthrough suppression, breakdown improvement, series resistance reduction, and parasitic gain reduction in high-voltage analog devices. These buried layers are also used to generate alignment markers for subsequent post epitaxial (EPI) photo processes.

Unfortunately, as shown in Prior Art FIG. 1, the apparent location of the buried layer (BL) marker can be shifted by several microns during EPI growth on off-axis starting materials. Additionally, thorough analysis indicates that the buried layer shift can significantly impact electrical device behavior. Consequently, precise determination and monitoring of buried layer shift due to EPI growth is critical in technology development and manufacturing. Buried layer shift tolerance not only affects inter-device spacing but also affects device size and can potentially make the device larger. Further, a larger buried layer shift tolerance requires a larger buried layer overlap to account for process variation and guarantee component performance. Tightening the buried layer shift tolerance would help reduce the design rules and then reduce the die size.

Historically, the wafers have been cross-sectioned and scanning electron microscope (SEM) data of the cross-sectioned portion has been used to calculate the offset needed to compensate for this shift. However, this is a very destructive and costly process and the data it provides is very limited. Moreover, and possibly most limiting, the cross-sectioning and SEM analysis, because of its destructive nature, is only performed on a very small percentage of the wafers. For example, the cross-sectioning is often only performed at a single location on a single wafer in a lot of wafers. As one would expect, this provides limited quantities of data. Moreover, this does not allow for wafer-to-wafer analysis or within wafer analysis that is highly beneficial in the manufacture of semiconductor devices.

Accordingly, what is needed in the art is a new process for determining and accounting for the aforementioned buried layer shifts without experiencing the drawback of the prior art methods.

SUMMARY OF THE INVENTION

To address the above-discussed deficiencies of the prior art, the present invention provides a method for monitoring a shift in a buried layer in a semiconductor device and a method for manufacturing an integrated circuit using the method for monitoring the shift in the buried layer. The method for monitoring the shift in the buried layer, among other steps, includes forming a buried layer test structure in, on or over a substrate of a semiconductor device, the buried layer test structure including a first test buried layer located in or on the substrate, the first test buried layer shifted a predetermined distance with respect to a first test feature. The buried layer test structure further includes a second test buried layer located in or on the substrate, the second test buried layer shifted a predetermined but different distance with respect to a second test feature. The method for monitoring the shift in the buried layer may further include applying a test signal to the buried layer test structure to determine an actual shift of the first test buried layer and the second test buried layer relative to the predetermined shift of the first and second test buried layers. In addition to that disclosed above, the method for manufacturing the integrated circuit includes forming semiconductor devices in, on or over the substrate based upon the actual shift determined.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGS. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

Figure 1:
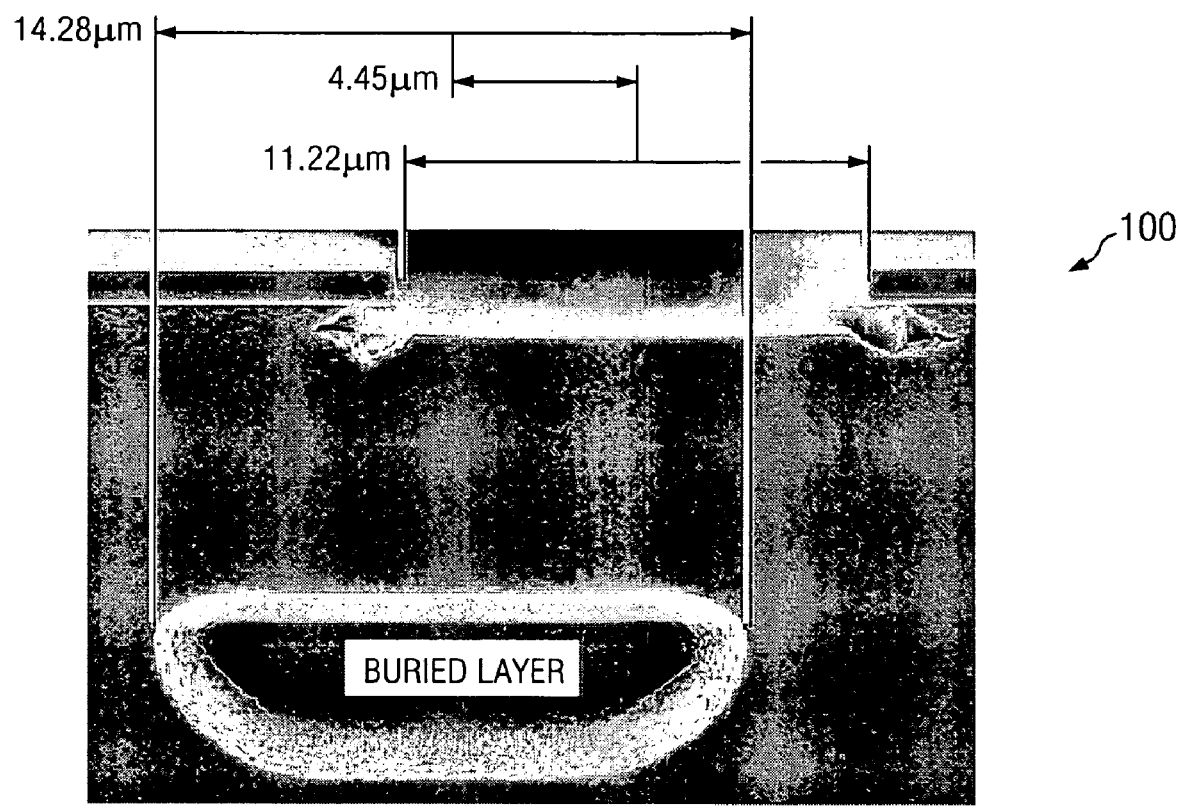
FIG. 1 illustrates that an apparent location of a buried layer (BL) marker can be shifted by several microns during epi growth on off-axis starting materials.
Figure 2:
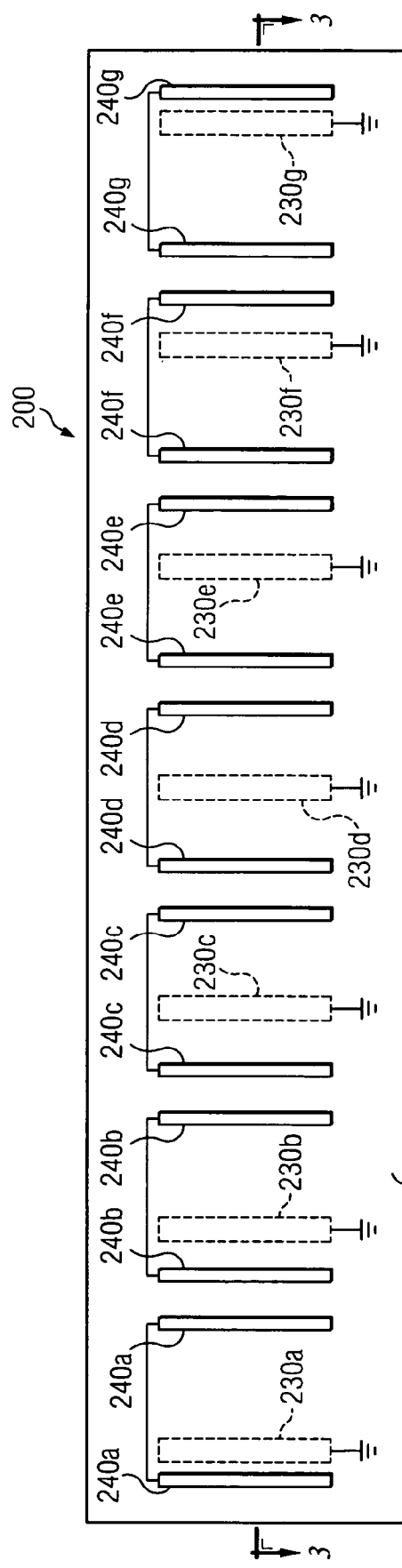
FIG. 2 illustrates a plan view of a buried layer test structure manufactured in accordance with the principles of the present invention.
Figure 3:
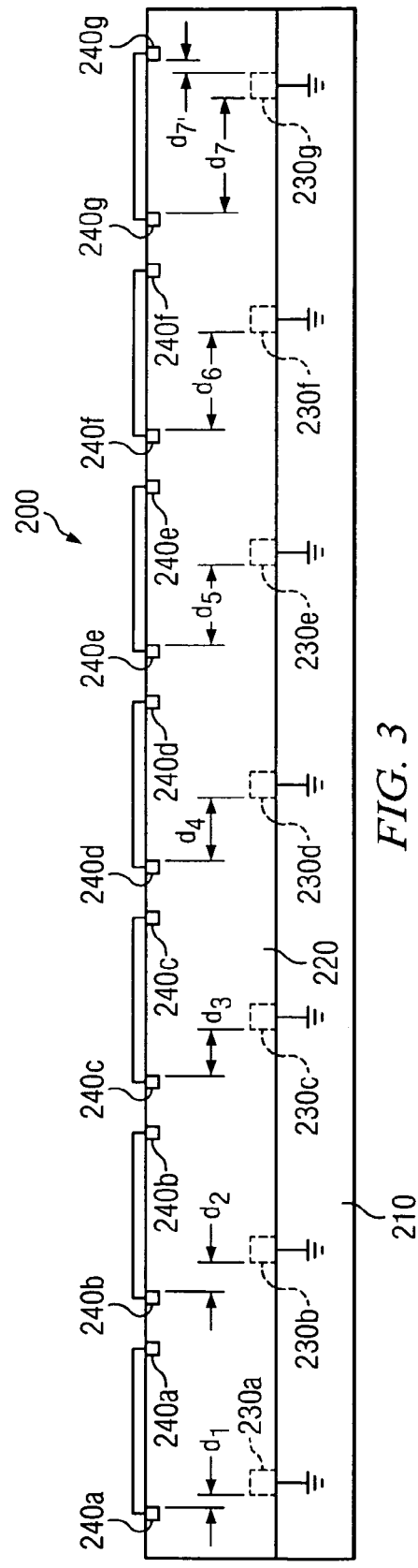
FIG. 3 illustrates a cross sectional view of a buried layer test structure manufactured in accordance with the principles of the present invention.

Referring initially to FIGS. 2 and 3, illustrated are a plan view, and cross sectional view, respectively, of a buried layer test structure 200 manufactured in accordance with the principles of the present invention. The buried layer test structure 200 illustrated in FIGS. 2 and 3, among other purposes, is configured to monitor a shift in buried layers that are commonly used in today's mixed signal devices. As previously mentioned, it is believed that the shift is caused by epitaxial growth on off-axis starting materials. Nevertheless, prior to the present invention, the shift was difficult to easily, quickly and accurately measure.

The buried layer test structure 200 illustrated in FIGS. 2 and 3 is typically formed in, on or over a substrate 210. In the particular embodiment shown in FIGS. 2 and 3, a portion of the buried layer test structure 200 is formed in or on the substrate 210 and another portion of the buried layer test structure is formed over the substrate 210, which in this instance is within an epitaxial layer 220. The substrate 210, in the particular embodiment shown, is a wafer substrate. Nevertheless, other substrates could also comprise the substrate 210.

The buried layer test structure 200 illustrated in the embodiment of FIGS. 2 and 3 initially includes a plurality of test buried layers 230a–230g located in or on the substrate 210. The plurality of test buried layers 230a–230g are substantially similar, if not identical, to the buried layers that might be used in the manufacture of mixed signal devices, as discussed above. For instance, the plurality of test buried layers 230a–230g could comprise an oxide, a heavily doped region, or any other known or hereafter discovered buried layer without departing from the scope of the present invention. In many instances, the plurality of test buried layers 230a–230g are formed at the same time as the buried layers that might be used in the manufacture of mixed signal devices.

In an advantageous embodiment of the present invention, the test buried layers 230a–230g are held at ground potential. As those skill in the art appreciate, the test buried layers 230a–230g may either be hard wired to remain at ground potential, or in an alternative embodiment may selectively be set to ground potential. In any event, one embodiment of the method for monitoring the shift of a buried layer in a semiconductor device in accordance with the principles of the present invention desires that the test buried layers 230a–230g be held at ground potential.

Located over the substrate 210 within the epitaxial layer 220 and on opposing sides of the plurality of test buried layers 230a–230g are a plurality of test features 240a–240g, respectively. In the given embodiment, however, the plurality of test features 240a–240g are illustrated as sets of test regions 240a–240g. The plurality of sets of test regions 240a–240g, in an exemplary embodiment, are sets of doped regions, such as well regions. In one embodiment of the present invention, the plurality of sets of test regions 240a–240g are well regions substantially similar to those used in the manufacture of the semiconductor devices. For instance, during the manufacturing of the well regions of the semiconductor devices in the epitaxial layer 220 the test regions 240a–240g could be formed. While the sets of test regions 240a–240g will most likely be formed in the epitaxial layer 220 of the semiconductor device, they may be formed in various different layers and stay within the scope of the present invention.

The spacing of the individual portions of the test regions 240a–240g with respect to themselves may be important. For instance, the left and right most portions of the test regions 240a–240g should be spaced a sufficient distance apart to provide the desired information, but should not be too large to take up an excessive amount of spaces. In one embodiment of the present invention it is desired that the left and right most portions of the test regions 240a–240g have a space between them ranging from about 35 μm to about 45 μm. This may provide for a space between the test buried layer 230a–230g and their nearest associated left or right most portion of the test regions 240a–240g ranging from about 5 μm to about 25 μm. This distance is represented as $d_1$ to $d_7$, discussed below. Nevertheless, other spacing neither shown nor discussed might also be used. Additionally, it is desired that the spacing between the left and right portions of the different test regions 240a–240g be substantially identical.

The plurality of test buried layers 230a–230g, as required by the present invention and illustrated, should be located predetermined but differing distances ($d_1$ to $d_7$) from individual ones of the sets of test regions 240a–240g. In an exemplary embodiment, the differing distances are increasing for a given direction (e.g., $d_1<d_2<d_3<d_4<d_5<d_6<d_7$). For instance, as shown, the test buried layer 230a is located a distance ($d_1$) from the left most portion of the test region 240a. The test buried layer 230b, on the other hand, is located a distance ($d_2$) from the left most portion of the test region 240b, where $d_2>d_1$. Accordingly, the test buried layer 230b is located just slightly further from the left most portion of its test region 240b than the test buried layer 230a is located from the left portion of its test region 240a. Just the same, the test buried layer 230b is located just slightly nearer to the right most portion of its test region 240b than the test buried layer 230a is located to the right most portion of its test region 240a.

The same predetermined, but differing distances, should also be applied to the remaining test buried layers 230c–230g to their respective test regions 240c–240g. In the exemplary embodiment shown, the last test buried layer 230g is located about equidistance to the right most portion of its test region 240g, as the first test buried layer 230a is located to the left most portion of its test region 240a. Thus, distance ($d_1$) is substantially equal to distance ($d_7'$). Nevertheless, while it is shown in FIGS. 2 and 3 that the location of the first and last test buried layers, the second and next to last test buried layers, etc. are substantial mirror images of one another, those skilled in the art understand that it is not required.

The buried layer test structure 200 shown in FIGS. 2 and 3 includes seven test buried layers 230a–230g and seven associated sets of test regions 240a–240g. Those skilled in the art appreciate, however, that the number of test buried layers and associated sets of test regions may vary widely and remain within the scope of the present invention. Nevertheless, most embodiments of the present invention would use from about 3 to about 10 test buried layers and about 3 to about 10 associated sets of test regions, per buried layer test structure.

In the illustrative embodiment shown in FIGS. 2 and 3 the individual sets of test regions 240a–240g are shorted between themselves. For instance, the left most and right most portions of the test region 240a are shorted together.

The same holds true for the left most and right most portions of the remaining test regions 240b–240g. The shorting of the individual portions of each of the test regions 240a–240g, at least in this embodiment, is desired to monitor the shift of the buried layer in a semiconductor device in accordance with the principles of the present invention. Other configurations, however, might also be used to monitor the shift in the buried layer in the semiconductor device. For example, one skilled in the art understands, that other embodiments exist where the test buried layers 230a–230g are biased and the sets of test regions 240a–240g are held at ground potential, which is opposite to that previously discussed.

Figure 4:
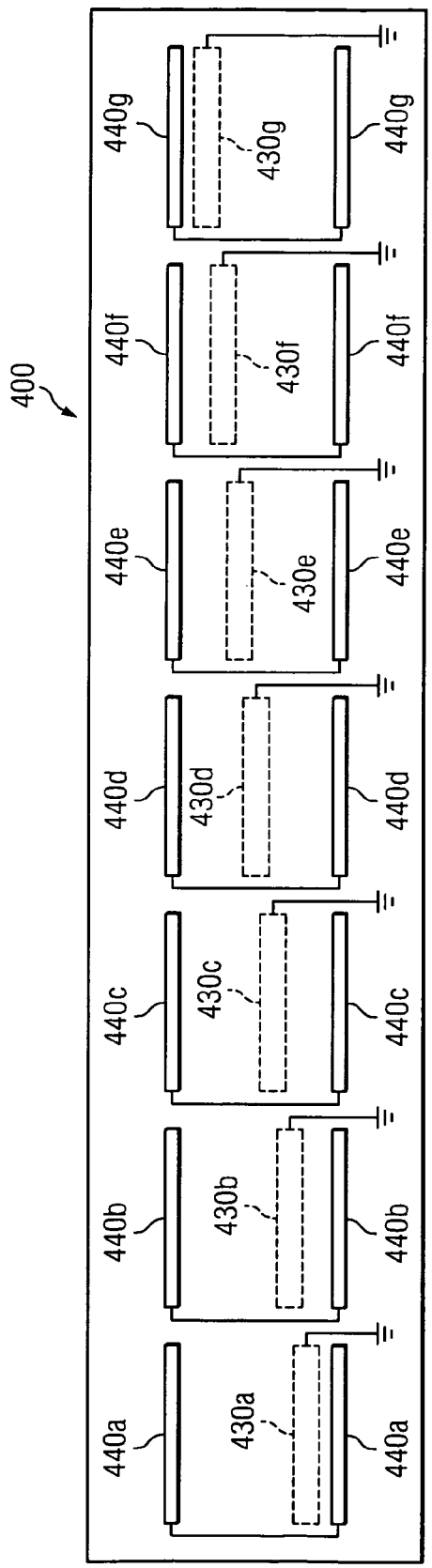
FIG. 4 illustrates another embodiment of a test buried layer test structure in accordance with the principles of the present invention.

Turning briefly to FIG. 4, illustrated is another embodiment of a test buried layer test structure 400 in accordance with the principles of the present invention. The second buried layer test structure 400 is substantially similar to the first buried layer test structure 200, with the exception that the plurality of test buried layers 430a–430g and associated plurality of sets of test regions 440a–440g of the second buried layer test structure 400 are positioned perpendicular to the plurality of test buried layers 230a–230g and associated plurality of sets of test regions 240a–240g of the first buried layer test structure 200. Accordingly, the first buried layer test structure 200 can monitor a shift in the buried layer in a first direction (e.g., the x-direction) and the second buried layer test structure 400 can monitor a shift in the buried layer in a second perpendicular direction (e.g., the y-direction). Thus, rather than the buried layer test structure 400 being used in place of the buried layer test structure 200 illustrated in FIGS. 2 and 3, it is typically intended to be used in conjunction with the buried layer test structure 200.

Figure 5:
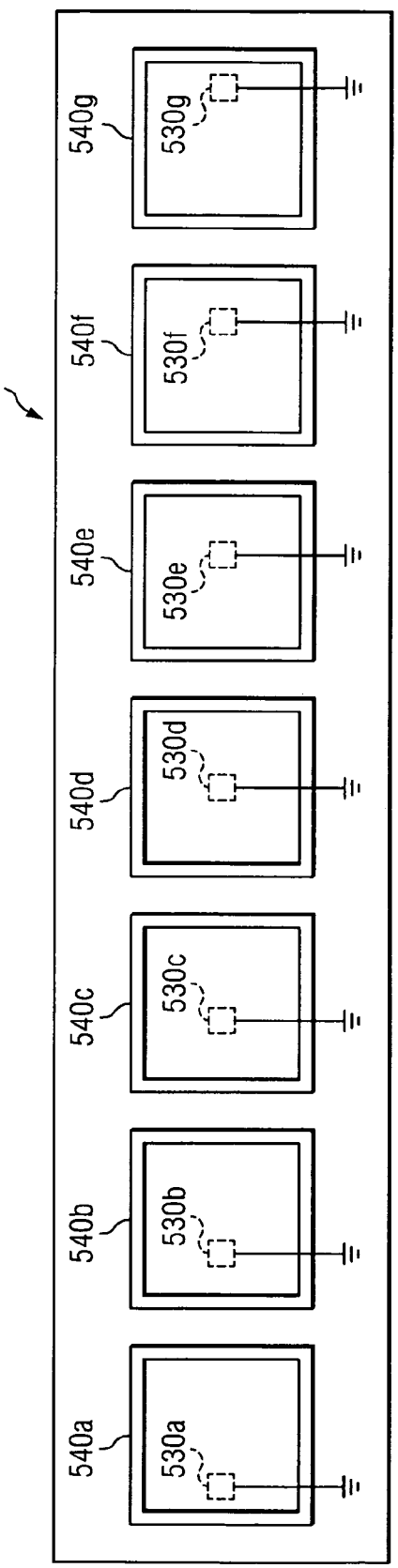
FIG. 5 illustrates another embodiment of a test buried layer test structure in accordance with the principles of the present invention

Turning briefly to FIG. 5, illustrated is another embodiment of a test buried layer test structure 500 manufactured in accordance with the principles of the present invention. The third buried layer test structure 500, in contrast to the first two buried layer test structures 200, 400, is a ring structure. The third buried layer test structure 500 includes a plurality of test buried layers 530a–530g and associated plurality of test features 540a–540g. Accordingly, the third buried layer test structure 500 can monitor a shift in the buried layer in a first direction (e.g., the x-direction) and a second perpendicular direction (e.g., the y-direction). In many instances, however, the embodiments of FIGS. 2 and 4 are preferred because they can decouple the monitoring in the x-direction from that in the y-direction. Nevertheless, the embodiment of FIG. 5 may be used and is within the scope of the present invention.

Figure 6:
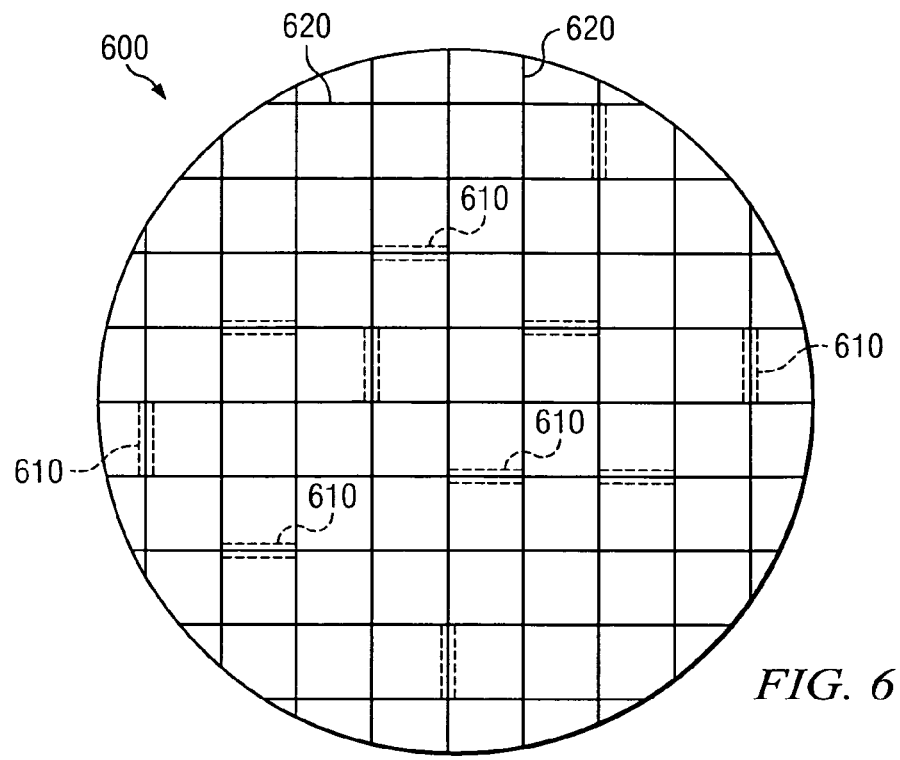
FIG. 6 illustrates a plan view of a production wafer having a plurality of buried layer test structures, similar to the buried layer test structures of FIGS. 2–4, thereon.

Turning briefly to FIG. 6, with continued reference to FIGS. 2–4, illustrated is a plan view of a production wafer 600 having a plurality of buried layer test structures 610, similar to the buried layer test structures 200, 400, thereon. As is illustrated in FIG. 6, any number of different buried layer test structures 610 may be located on the production wafer 600. Similarly, the plurality of buried layer test structures 610 may be positioned in a number of different locations. In the most common embodiment, however, the buried layer test structures 610 are positioned on streets 620 of the production wafer 600. As the buried layer test structures 610 are located on the streets 620 of the production wafer 600, cleaving the production wafer 600 into individual dies substantially removes the buried layer test structures.

Unique to the present invention, the combination of the location and number of buried layer test structures on a single production wafer allows for within wafer monitoring of buried layer shift in the semiconductor devices. This provides a distinct advantage over the prior art, which was basically limited to monitoring of buried layer shifting in a few wafers within a lot. Thus, not only can the present invention easily and quickly monitor buried layer shift in every wafer within a lot, it also can easily and quickly monitor buried layer shift at multiple positions within each of the individual wafers. Moreover, the monitoring of the present invention is non-evasive, as the wafer need not be destroyed to do the testing, and it ultimately provides more relevant data.

Returning to FIGS. 2 and 3, the discussion will now turn from the buried layer test structure 200 itself, to the use of the buried layer test structure 200 to monitor an actual shift in a buried layer in a semiconductor device. The present invention has recognized that by measuring an electrical characteristic, for example a breakdown voltage, of each of the combinations of test buried layers 230a–230g and sets of test regions 240a–240g, an actual shift of the test buried layers 230a–230g may be determined with respect to the predetermined shift of the test buried layers 230a–230g. This information may then be attributed to actual production buried layers in the production portions of the wafer. Accordingly, by adjusting manufacturing parameters, particularly a calculated offset to the photolithography process based on the actual shift of the test buried layers 230a–230g, the affects of the actual shift can be substantially alleviated.

In the given embodiments, the electrical characteristic for each of the test buried layers 230a–230g and related test regions 240a–240g may be obtained by applying a test signal to each of collections of test buried layers 230a–230g and related test regions 240a–240g. The test signals, in turn, provide breakdown voltages for the various different collections of test buried layers 230a–230g and related test regions 240a–240g. These breakdown voltages, in view of the predetermined but varying distances previously discussed, may be used to calculate the actual shift of the test buried layers 230a–230g. Other characteristics, such as leakage current, may also be used to calculate the actual shift of the test buried layers 230a–230g.

Figure 7:
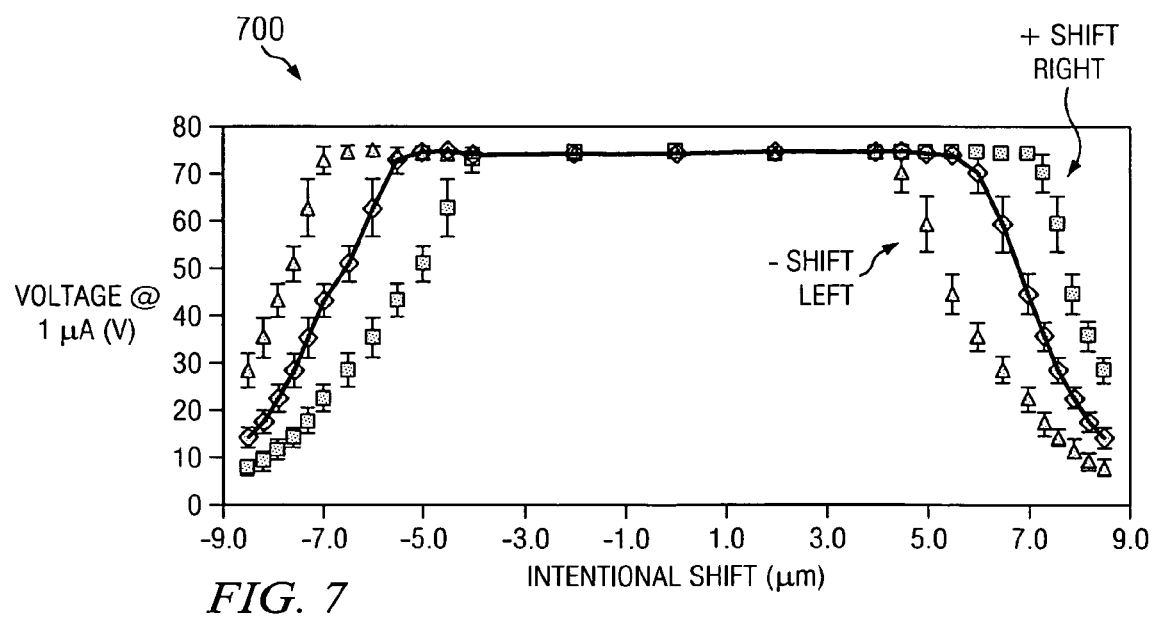
FIG. 7 illustrates an ideal plot of breakdown voltage vs. intentional layout.

Turning now to FIG. 7, illustrated is an ideal plot 700 of breakdown voltage vs. intentional layout. The plot 700 can be used to determine the actual shift of the test buried layers relative to the predetermined shift of the test buried layers. As one would expect, mis-alignment along the x-axis should be symmetric if the predetermined buried layer shift matches the actual buried layer shift. If there is any deviation of the predetermined buried layer shift, the breakdown curve will move either left or right based on the actual shift of the buried layer being seen on the silicon. Thus, plot 700 shows breakdown voltage of each individual test buried layer and associated set of test region vs. the predetermined shift of each individual test buried layer and associated set of test region.

The actual shift in the buried layer can easily be determined visually based on the plot 700. For instance, the data denoted by the triangles has an actual shift to the left of about 1.2 μm. On the other hand, the data denoted by the squares has an actual shift to the right of about 1.2 μm. This information could then be fed forward to the photolithography steps to create an offset to account for the actual shift. Additionally, while it has been discussed that the actual shift can be observed visually, it is conceivable, if not probable, for a computer and its associated software to collect and analyze the data. For example, a computer could use a least square fit to calculate the actual buried layer shift, which would easily, quickly and accurately enable one to get buried layer shift on each test site. The computer could then feed forward the appropriate data to the photolithography process to account for the actual shift.

Figure 8:
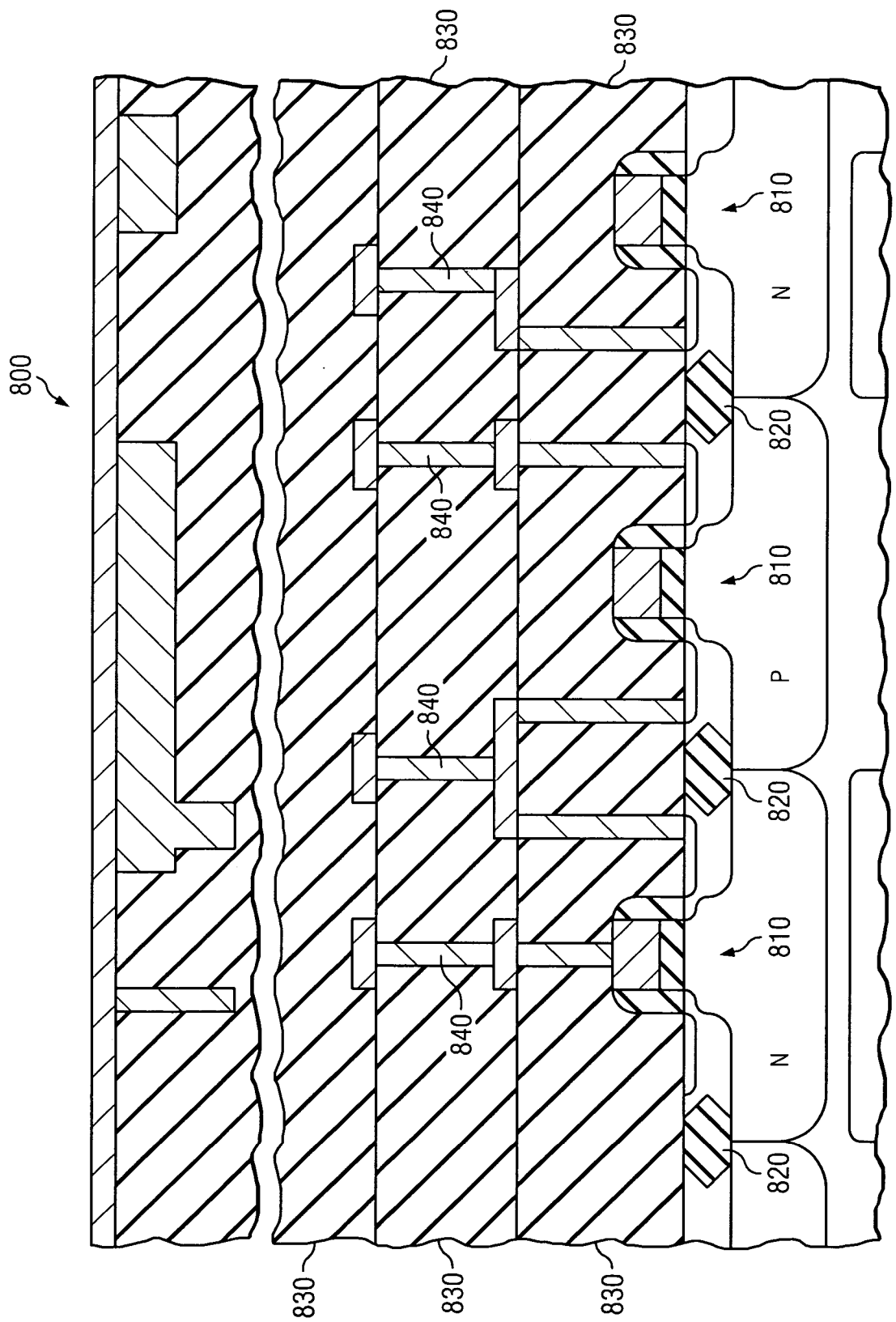
FIG. 8 illustrates a cross-sectional view of an integrated circuit (IC) manufactured in accordance with the principles of the present invention.

Referring finally to FIG. 8, illustrated is a cross-sectional view of an integrated circuit (IC) 800 manufactured in accordance with the principles of the present invention. The IC 800 may include devices, such as transistors used to form CMOS devices, BiCMOS devices, Bipolar devices, or other types of devices. The IC 800 may further include passive devices, such as inductors or resistors, or it may also include optical devices or optoelectronic devices. Those skilled in the art are familiar with these various types of devices and their manufacture.

In the particular embodiment illustrated in FIG. 8, the IC 800 includes transistor devices 810 located between isolation structures 820. The IC 800 of FIG. 7 further includes dielectric layers 830 located over the transistor devices 810. In accordance with the principles of the present invention, interconnects 840 are located within the dielectric layers 830. The devices of the IC 800, as those skilled in the art are aware, maybe manufactured using the method discussed above with respect to FIGS. 2–7.

Although the present invention has been described in detail, those skilled in the art should understand that they can make various changes, substitutions and alterations herein without departing from the spirit and scope of the invention in its broadest form.

What is claimed is:

1. A method for monitoring a shift in a buried layer in a semiconductor device, comprising:
   forming a buried layer test structure in, on or over a substrate of a semiconductor device, the buried layer test structure including:
      a first test buried layer located in or on the substrate, the first test buried layer shifted a first predetermined distance with respect to a first test feature; and
      a second test buried layer located in or on the substrate, the second test buried layer shifted a second predetermined distance with respect to a second test feature, the second predetermined distance being different from the first predetermined distance; and
   applying a test signal to the buried layer test structure to determine an actual shift of the first test buried layer and the second test buried layer relative to the predetermined shift of the first and second test buried layers.

2. The method as recited in claim 1 wherein applying a test signal includes applying a first test signal to the first test buried layer and the first test feature and applying a second test signal to the second test buried layer and the second test feature.

3. The method as recited in claim 2 wherein the first test signal provides a first breakdown voltage and the second test signal provides a second different breakdown voltage and wherein the first breakdown voltage and the second different breakdown voltage are used to determine an actual shift of the first test buried layer and the second test buried layer relative to the predetermined shift of the first and second test buried layers.

4. The method as recited in claim 1 wherein the first test feature is a first set of test regions and wherein the second test feature is a second set of test regions.

5. The method as recited in claim 4 wherein applying a test signal includes shorting between the first set of test regions, setting the first test buried layer to ground potential and measuring a first breakdown voltage, and shorting between the second set of test regions, setting the second test buried layer to ground potential and measuring a second breakdown voltage, and further including monitoring the difference between the first breakdown voltage and the second breakdown voltage to determine an actual shift of the first test buried layer and the second test buried layer relative to the predetermined shift of the first and second test buried layers.

6. The method as recited in claim 1 wherein the first test feature is a first ring test region and wherein the second test feature is a second ring test region.

7. The method as recited in claim 1 wherein forming a buried layer test structure includes forming a first buried layer test structure for determining an actual shift in a first direction, and further including forming a second buried layer test structure for determining an actual shift in a second direction, the second direction perpendicular to the first direction.

8. The method as recited in claim 7 wherein the second buried layer test structure includes:
   a third test buried layer located in the substrate, the third test buried layer shifted a third predetermined distance in the second direction with respect to a third test feature; and
   a fourth test buried layer located in the substrate, the fourth test buried layer shifted a fourth predetermined distance in the second direction with respect to a fourth test feature, wherein the fourth predetermined distance is different from the third predetermined distance.

9. The method as recited in claim 1 wherein the buried layer test structure includes from about 3 to about 10 test buried layers shifted predetermined but differing distances with respect to about 3 to about 10 test features, respectively.

10. The method as recited in claim 1 wherein the buried layer test structure is located within scribe lines for a wafer.

11. The method as recited in claim 1 wherein the test features are doped test features located over the substrate.

12. The method as recited in claim 1 wherein the test features are sets of well regions located over the substrate.

13. A method for manufacturing an integrated circuit, comprising;
   forming a buried layer test structure in, on or over a substrate of a semiconductor device, the buried layer test structure including:
      a first test buried layer located in or on the substrate, the first test buried layer shifted a first predetermined distance with respect to a first test feature; and
      a second test buried layer located in or on the substrate, the second test buried layer shifted a second predetermined distance with respect to a second test feature, the second predetermined distance different from the first predetermined distance;
   applying a test signal to the buried layer test structure to determine an actual shift of the first test buried layer and the second test buried layer relative to the predetermined shift of the first and second test buried layers; and
   forming semiconductor devices in or over the substrate based upon the actual shift determined.

14. The method as recited in claim 13 wherein applying a test signal includes applying a first test signal to the first test buried layer and the first test feature and applying a second test signal to the second test buried layer and the second test feature.

15. The method as recited in claim 14 wherein the first test signal provides a first breakdown voltage and the second test signal provides a second different breakdown voltage and wherein the first breakdown voltage and the second different breakdown voltage are used to determine an actual shift of the first test buried layer and the second test buried layer relative to the predetermined shift of the first and second test buried layers.

16. The method as recited in claim 13 wherein the first test feature is a first set of test regions and the second test feature is a second set of test regions.

17. The method as recited in claim 16 wherein applying a test signal includes shorting between the first set of test regions, setting the first test buried layer to ground potential and measuring a first breakdown voltage, and shorting between the second set of test regions, setting the second test buried layer to ground potential and measuring a second breakdown voltage, and further including monitoring the difference between the first breakdown voltage and the second breakdown voltage to determine an actual shift of the first test buried layer and the second test buried layer relative to the predetermined shift of the first and second test buried layers.

18. The method as recited in claim 13 wherein the first test feature is a first ring test region and the second test feature is a second ring test region.

19. The method as recited in claim 13 wherein forming a buried layer test structure includes forming a first buried layer test structure for determining an actual shift in a first direction, and further including forming a second buried layer test structure for determining an actual shift in a second direction, wherein the second direction is perpendicular to the first direction.

20. The method as recited in claim 19 wherein the second buried layer test structure includes;
    a third test buried layer located in the substrate, the third test buried layer shifted a third predetermined distance in the second direction with respect to a third test feature; and
    a fourth test buried layer located in the substrate, the fourth test buried layer shifted a fourth predetermined distance in the second direction with respect to a fourth test feature, wherein the fourth predetermined distance is different from the third predetermined distance.

21. The method as recited in claim 13 wherein the buried layer test structure includes from about 3 to about 10 test buried layers shifted predetermined but differing distances with respect to about 3 to about 10 test features, respectively.

22. The method as recited in claim 13 wherein the buried layer test structure is located within scribe lines for a wafer.

23. The method as recited in claim 13 wherein the test features are each sets of doped regions located over the substrate.

24. The method as recited in claim 13 wherein the test features are each sets of well regions locate over the substrate.

25. The method as recited in claim 13 wherein forming semiconductor devices in or over the substrate based upon the actual shift determined includes entering an offset into the photolithography process to account for the actual shift determined.

26. The method as recited in claim 25 wherein forming semiconductor devices in or over the substrate includes positioning well regions and gate structures over buried layers based upon the actual shift determined.

27. A buried layer test structure for monitoring a shift in a buried layer in a semiconductor device, comprising:
    a first test buried layer located in or on a substrate, the first test buried layer shifted a first predetermined distance with respect to a first test feature and configured to receive a first test signal; and
    a second test buried layer located in or on the substrate, the second test buried layer shifted a second predetermined distance with respect to a second test feature and configured to receive a second test signal, the second predetermined distance different from the first predetermined distance, wherein data obtained by applying the first and second test signals to the first and second test buried layers and their associated first and second test regions is configured to determine an actual shift of the first and second test buried layers relative to the predetermined shift of the first and second test buried layers.

28. The buried layer test structure as recited in claim 27 wherein the first and second test buried layers are located within a scribe line of a wafer.

29. The buried layer test structure as recited in claim 27 including from about 3 to about 10 test buried layers shifted predetermined but differing distances with respect to about 3 to about 10 test features, respectively.

30. The buried layer test structure as recited in claim 27 wherein the first and second test features are first and second sets of doped regions located over the substrate.

31. The buried layer test structure as recited in claim 27 wherein the first and second test features are first and second sets of well regions located over the substrate.

* * * * *